United States Patent
Mukunoki et al.

(10) Patent No.: US 11,012,066 B2
(45) Date of Patent: May 18, 2021

(54) DRIVE DEVICE FOR POWER SEMICONDUCTOR ELEMENT

(71) Applicant: Mitsubishi Electric Corporation, Tokyo (JP)

(72) Inventors: Yasushige Mukunoki, Tokyo (JP); Takeshi Horiguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/975,716

(22) PCT Filed: Jan. 11, 2019

(86) PCT No.: PCT/JP2019/000654
§ 371 (c)(1),
(2) Date: Aug. 26, 2020

(87) PCT Pub. No.: WO2019/207847
PCT Pub. Date: Oct. 31, 2019

(65) Prior Publication Data
US 2020/0412356 A1 Dec. 31, 2020

(30) Foreign Application Priority Data
Apr. 27, 2018 (JP) .............................. JP2018-086454

(51) Int. Cl.
*H03K 17/08* (2006.01)
*H03K 17/00* (2006.01)
(Continued)

(52) U.S. Cl.
CPC .......... *H03K 17/0828* (2013.01); *H02M 1/08* (2013.01); *H03K 17/127* (2013.01)

(58) Field of Classification Search
CPC .... H03K 17/007; H03K 17/08; H03K 17/081; H03K 17/0812; H03K 17/16;
(Continued)

(56) References Cited

U.S. PATENT DOCUMENTS

| 8,963,585 B2 * | 2/2015 | Lobsiger | H02M 1/088 327/108 |
| 10,491,207 B2 * | 11/2019 | Norling | H01L 21/02472 |

(Continued)

FOREIGN PATENT DOCUMENTS

JP  2017-070051 A  4/2017

OTHER PUBLICATIONS

International Search Report and Written Opinion dated Feb. 5, 2019 for PCT/JP2019/000654 filed on Jan. 11, 2019, 6 pages including English Translation of the International Search Report.

*Primary Examiner* — An T Luu
(74) *Attorney, Agent, or Firm* — Xsensus LLP

(57) ABSTRACT

A plurality of drive circuits each drive a corresponding one of a plurality of power semiconductor elements connected in parallel. Each of the drive circuits includes a control command unit, a current detector, a differentiator, and an integrator. The current detector detects a gate current that flows into a gate terminal of a corresponding one of the power semiconductor elements after the control command unit outputs a turn-on command. The differentiator performs time differentiation of the gate current detected by the current detector. The integrator performs time integration of the gate current detected by the current detector. Based on a differential value and an integral value in each of the drive circuits, the determination unit determines whether an overcurrent state occurs or not in any of the plurality of power semiconductor elements.

8 Claims, 7 Drawing Sheets

(51) Int. Cl.
*H02M 1/08* (2006.01)
*H03K 17/082* (2006.01)
*H03K 17/12* (2006.01)

(58) Field of Classification Search
CPC .................. H03K 2217/0027; H02M 1/088;
H02M 1/10; H02M 2001/0058
See application file for complete search history.

(56) References Cited

U.S. PATENT DOCUMENTS 10,790,813 B2 * 9/2020 Mukunoki ........... H03K 17/082
2018/0248543 A1 8/2018 Senda

* cited by examiner

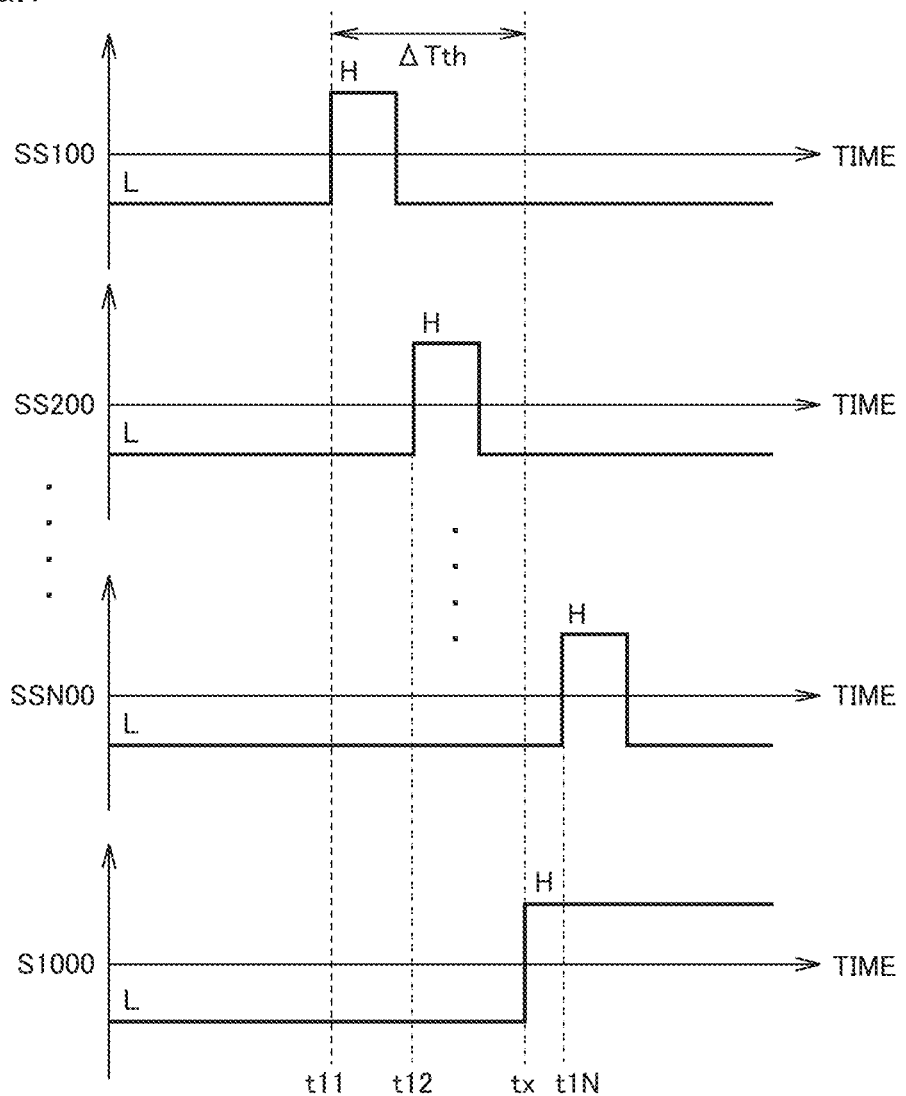

DRIVE DEVICE FOR POWER SEMICONDUCTOR ELEMENT

CROSS-REFERENCE TO RELATED APPLICATIONS

The present application is based on PCT filing PCT/JP2019/000654, filed Jan. 11, 2019, which claims priority to JP 2018-086454, filed Apr. 27, 2018, the entire contents of each are incorporated herein by reference.

TECHNICAL FIELD

The present disclosure relates to a drive device for a power semiconductor element, and more particularly to a drive device having a function of detecting an overcurrent state in any of a plurality of power semiconductor elements connected in parallel.

BACKGROUND ART

In a power converter formed using a power semiconductor element such as an insulated gate bipolar transistor (IGBT) and a metal-oxide-semiconductor field-effect transistor (MOSFET), a plurality of power semiconductor elements are connected in parallel to achieve a large capacity for the purpose of ensuring a desired electric power capacity. A current flows through the plurality of power semiconductor elements so as to be shared equally among the power semiconductor elements, thereby allowing handling of a high current.

In the above-mentioned configuration, however, when a current concentrates on any of the power semiconductor elements to thereby cause an overcurrent state, such a power semiconductor element in an overcurrent state may be thermally broken. Accordingly, the drive device that drives a plurality of power semiconductor elements connected in parallel requires a function of detecting an overcurrent state in any of the power semiconductor elements for protecting the power semiconductor elements from thermal breakage.

For example, Japanese Patent Laying-Open No. 2017-70051 (PTL 1) discloses a configuration of a drive device that drives a plurality of IGBTs connected in parallel. The drive device includes a current detector for detecting an emitter current (a main current) in each of the IGBTs and determines whether an overcurrent occurs or not based on a detection value by this current detector.

CITATION LIST

Patent Literature

PTL 1: Japanese Patent Laying-Open No. 2017-70051

SUMMARY OF INVENTION

Technical Problem

However, the drive device disclosed in PTL 1 needs to include a current detector for detecting a main current in a power semiconductor element. Since such a current detector needs to be capable of detecting a high current equivalent to a main current, a large-sized and high-cost amperemeter is to be inevitably used. This leads to a concern that the drive device is increased entirely in size and also increased in cost.

The present invention has been made to solve the above-described problems. An object of the present invention is to provide a drive device for a power semiconductor element, by which an overcurrent state in any of a plurality of power semiconductor elements connected in parallel can be detected in a simple configuration.

Solution to Problem

A drive device for a power semiconductor element according to the present disclosure drives a plurality of power semiconductor elements connected in parallel. Each of the power semiconductor elements has a first terminal, a second terminal, and a gate terminal. The drive device includes a plurality of drive circuits each to drive a corresponding power semiconductor element of the power semiconductor elements. Each of the drive circuits includes a control command unit, a current detector, a differentiator, and an integrator. The control command unit outputs a turn-on command for the corresponding power semiconductor element. The current detector detects a gate current that flows into the gate terminal of the corresponding power semiconductor element after the control command unit outputs the turn-on command. The differentiator performs time differentiation of the gate current detected by the current detector. The integrator performs time integration of the gate current detected by the current detector. The drive device further includes a determination unit. Based on a differential value by the differentiator and an integral value by the integrator in each of the drive circuits, the determination unit determines whether an overcurrent state occurs or not in any of the power semiconductor elements.

Advantageous Effects of Invention

According to the present disclosure, an overcurrent state in any of the plurality of power semiconductor elements connected in parallel can be detected in a simple configuration.

BRIEF DESCRIPTION OF DRAWINGS

FIG. 7 is a diagram for illustrating a determination operation in a determination unit.

DESCRIPTION OF EMBODIMENTS

Figure 1:
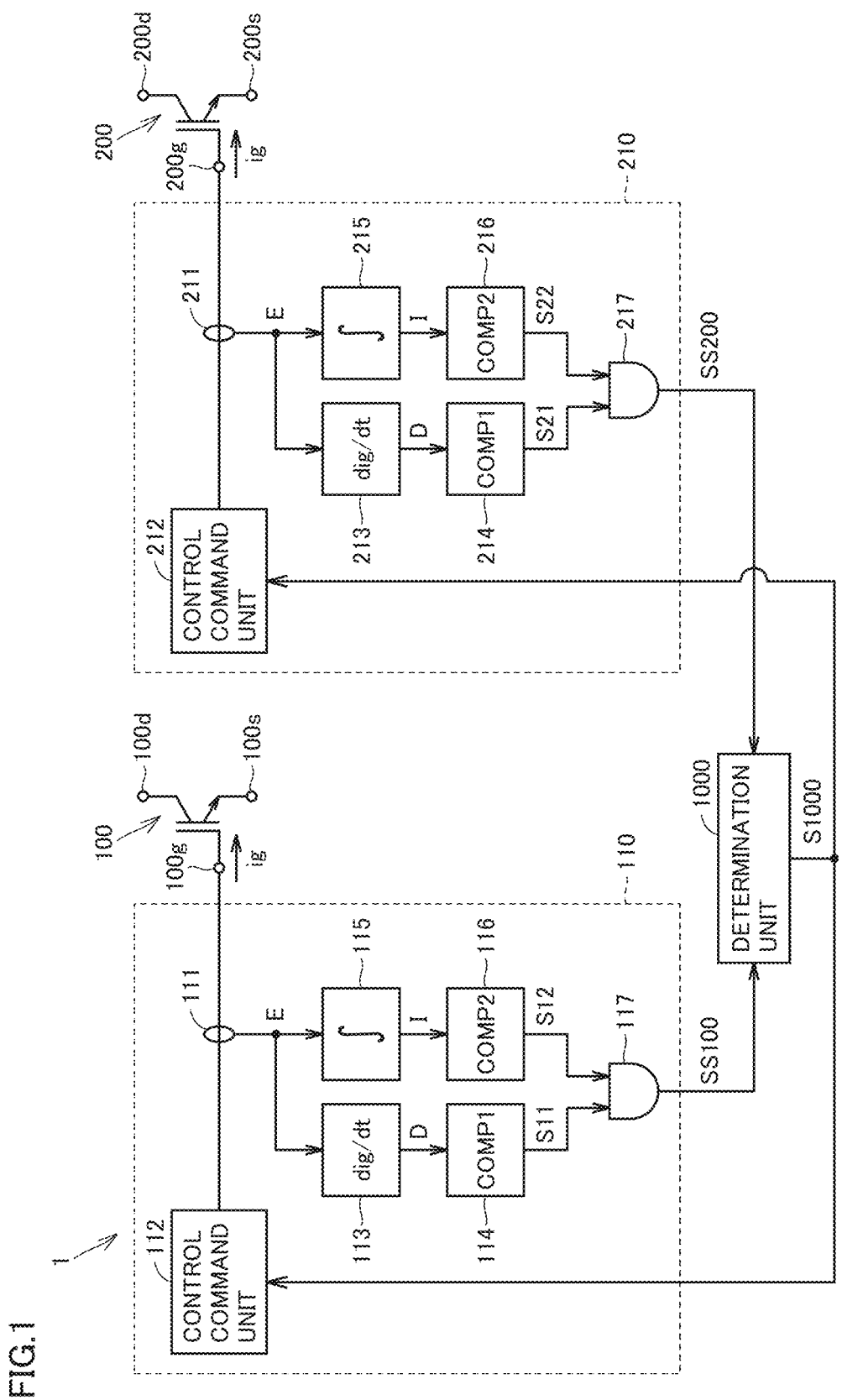
FIG. 1 is a diagram showing the configuration of a power semiconductor element and a drive device therefor according to the first embodiment.

The embodiments of the present invention will be hereinafter described in detail with reference to the accompanying drawings. In the following description, the same or corresponding components in the accompanying drawings will be designated by the same reference characters, and the description thereof will not be basically repeated.

First Embodiment

FIG. 1 is a diagram showing the configuration of a power semiconductor element and a drive device therefor according to the first embodiment. FIG. 1 illustrates a drive device that drives two power semiconductor elements 100 and 200 connected in parallel. The number of power semiconductor elements connected in parallel may be more than one and may be three or more. Also, the power semiconductor element may have a discrete shape or a modular shape.

Since power semiconductor elements 100 and 200 have the same structure, these power semiconductor elements 100 and 200 are brought into conduction or interrupted at the same timing ideally in response to a command input from outside. As power semiconductor elements 100 and 200 are brought into conduction at the same timing, the current flowing through a power converter can be equally shared between power semiconductor elements 100 and 200.

However, due to manufacturing variations and the like, power semiconductor elements 100 and 200 may be brought into conduction at different timings and interrupted at different timings. When power semiconductor elements 100 and 200 are brought into conduction at different timings, only one of power semiconductor elements 100 and 200 is brought into conduction, thereby bringing about an overcurrent state in which a current flows through this one power semiconductor element in a concentrated manner. This leads to a concern that this one power semiconductor element may be consequently thermally broken.

A drive device 1 according to the present first embodiment has a function of detecting an overcurrent state in any of power semiconductor elements 100 and 200 connected in parallel, so as to protect power semiconductor elements 100 and 200 from an overcurrent state.

FIG. 1 shows MOSFETs as power semiconductor elements 100 and 200, each of which is however not necessarily limited to an MOSFET but may be a self-arc-extinguishing type semiconductor element such as an IGBT. Power semiconductor elements 100 and 200 each are included in a power converter such as an inverter that converts direct-current (DC) power into alternating-current (AC) power, and a rectifier that converts AC power into DC power.

Furthermore, the material forming power semiconductor elements 100 and 200 is not limited to silicon, but may be a wideband gap semiconductor (for example, silicon carbide, gallium nitride, gallium oxide, a diamond, and the like).

Power semiconductor element 100 has a drain terminal 100d, a source terminal 100s, and a gate terminal 100g. Power semiconductor element 200 has a drain terminal 200d, a source terminal 200s, and a gate terminal 200g.

Drain terminals 100d and 200d each correspond to one example of the "first terminal". Source terminals 100s and 200s each correspond to one example of the "second terminal". The voltages applied to drain terminals 100d and 200d are higher than the respective voltages applied to source terminals 100s and 200s.

Gate terminal 100g is connected to a drive circuit 110 and receives a control command (a gate command) from drive circuit 110. Gate terminal 200g is connected to a drive circuit 210 and receives a control command (a gate command) from drive circuit 210.

Referring to FIG. 1, drive device 1 serves to drive power semiconductor elements 100 and 200 connected in parallel and includes drive circuits 110, 210 and a determination unit 1000. Drive device 1 has a function of detecting an overcurrent state in any of power semiconductor elements 100 and 200, as will be described below.

Drive circuit 110 serves to drive power semiconductor element 100 and includes a gate current detection unit 111, a control command unit 112, a differentiator 113, a first comparator 114, an integrator 115, a second comparator 116, and a logic unit 117.

Upon reception of an ON command input from outside, control command unit 112 outputs, to gate terminal 100g of power semiconductor element 100, a gate command (a turn-on command) for bringing power semiconductor element 100 into a conducting state (an ON state) (hereinafter referred to as "turn on"). Thereby, power semiconductor element 100 is turned on and brought into a conducting state.

Upon reception of an OFF command input from outside, control command unit 112 outputs, to gate terminal 100g of power semiconductor element 100, a gate command (a turn-off command) for bringing power semiconductor element 100 into an interrupted state (an OFF state) (hereinafter referred to as "turn off"). Thereby, power semiconductor element 100 is turned off and brought into an interrupted state.

Gate current detection unit 111 detects a gate current ig that flows into gate terminal 100g of power semiconductor element 100 after reception of the turn-on command from control command unit 112. A commonly used amperemeter can be used as gate current detection unit 111. Gate current detection unit 111 outputs a signal showing a voltage E corresponding to detected gate current ig. Gate current detection unit 111 corresponds to one example of the "current detector".

Differentiator 113 performs time differentiation of voltage E corresponding to gate current ig detected by gate current detection unit 111, and outputs a differential value D. Differential value D is represented by D=dE/dt using voltage E. Differential value D is proportional to a differential value dig/dt that is obtained by time differentiation of gate current ig. Thus, differential value D substantially shows an inclination of the temporal change of gate current ig.

First comparator 114 compares differential value D obtained by differentiator 113 with a first reference value REF1, and outputs a signal S11 showing a comparison result. First reference value REF1 is set at zero. When differential value D is greater than first reference value REF1 (i.e., when D>0), signal S11 shifts to an "H (logic high)" level. On the other hand, when differential value D is equal to or less than first reference value REF1 (i.e., when D≤0), signal S11 shifts to an "L (logic low)" level.

Integrator 115 performs time integration of voltage E corresponding to gate current ig detected by gate current detection unit 111, and outputs an integral value I. Integral value I is represented by I=∫Edt using voltage E.

In this case, the relation of the following equation (1) is established between gate current ig flowing into gate terminal 100g of power semiconductor element 100 and a gate voltage Vgs applied between gate terminal 100g and source terminal 100s.

$$Vgs = 1/Cgs \cdot \int ig(t)dt \quad (1)$$

Also, Cgs shows a parasitic capacitance component (i.e., a gate-source capacitance) that occurs between gate terminal 100g and source terminal 100s in power semiconductor element 100.

Integral value I is proportional to an integral value ∫ig(t)dt that is obtained by time integration of gate current ig. Thus, based on the equation (1), integral value I is proportional to gate voltage Vgs.

Second comparator 116 compares integral value I obtained by integrator 115 with a second reference value REF2, and outputs a signal S12 showing a comparison result. Second reference value REF2 is greater than zero and, for example, set to be greater than zero and less than a Miller voltage of power semiconductor element 100. When integral value I is greater than second reference value REF2 (i.e., when I>REF2), signal S12 shifts to an "H" level. In contrast, when integral value I is equal to or less than second reference value REF2 (i.e., when I≤REF2), signal S12 shifts to an "L" level.

Logic unit 117 computes a logical product of: signal S11 output from first comparator 114; and signal S12 output from second comparator 116. Logic unit 117 outputs a signal SS100 showing a logical product. Signal SS100 shifts to an "H" when signals S11 and S12 each are at an "H" level. Also, signal SS100 shifts to an "L" level when at least one of signals S11 and S12 is at an "L" level.

In other words, when differential value D>0, and when integral value I>REF2, signal SS100 shifts to an "H" level. On the other hand, when differential value D≤0 or when integral value I≤REF2, signal SS100 shifts to an "L" level. Logic unit 117 outputs signal SS100 to determination unit 1000.

Drive circuit 210 serves to drive power semiconductor element 200 and includes a gate current detection unit 211, a control command unit 212, a differentiator 213, a first comparator 214, an integrator 215, a second comparator 216, and a logic unit 217. The basic configuration of drive circuit 210 is the same as that of drive circuit 110.

Specifically, upon reception of an ON command input from outside, control command unit 212 outputs a turn-on command for power semiconductor element 200 to gate terminal 200g of power semiconductor element 200. Upon reception of an OFF command input from outside, control command unit 212 outputs a turn-off command to gate terminal 200g of power semiconductor element 200.

Gate current detection unit 211 detects gate current ig that flows into gate terminal 200g of power semiconductor element 200 after reception of the turn-on command from control command unit 212. Gate current detection unit 211 outputs a signal that shows voltage E corresponding to detected gate current ig.

Differentiator 213 performs time differentiation of voltage E corresponding to gate current ig detected by gate current detection unit 211, and outputs differential value D. First comparator 214 compares differential value D obtained by differentiator 213 with first reference value REF1 (=0), and outputs a signal S21 showing a comparison result.

Integrator 215 performs time integration of voltage E corresponding to gate current ig detected by gate current detection unit 211, and outputs integral value I. Second comparator 216 compares integral value I obtained by integrator 215 with second reference value REF2, and outputs a signal S22 showing a comparison result.

Logic unit 217 computes a logical product of signal S21 output from first comparator 214 and signal S22 output from second comparator 216, and outputs a signal SS200 showing a logical product. When signals S21 and S22 each are at an "H" level, i.e., when differential value D>0 and when integral value I>REF2, signal SS200 shifts to an "H". When at least one of signals S21 and S22 is at an "L" level, i.e., when differential value D≤0 or when integral value I REF2, signal SS200 shifts to an "L" level. Logic unit 217 outputs signal SS200 to determination unit 1000.

Based on signal SS100 output from logic unit 117 of drive circuit 110 and signal SS200 output from logic unit 217 of drive circuit 210, determination unit 1000 determines whether an overcurrent state occurs or not in any of power semiconductor elements 100 and 200. Determination unit 1000 outputs a signal S1000 showing a determination result to control command units 112 and 212. The operation of determination unit 1000 will be described later.

Then, the operation of drive device 1 for a power semiconductor element according to the first embodiment will be described.

First, the operation of drive circuit 110 for power semiconductor element 100 will be described with reference to FIG. 2. The operation of drive circuit 210 for power semiconductor element 200 is the same as the operation of drive circuit 110 shown in FIG. 2.

Figure 2:
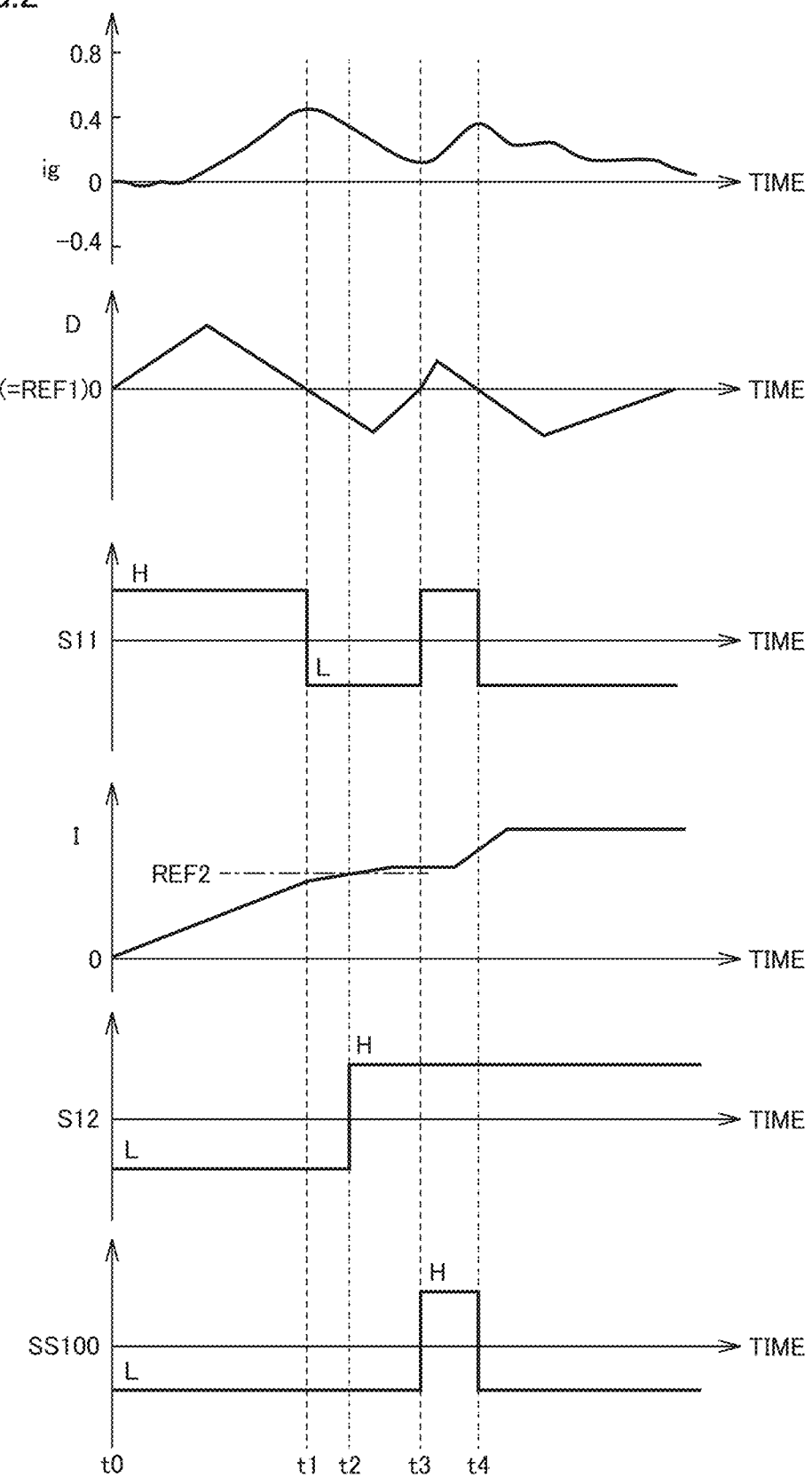
FIG. 2 is a waveform diagram showing the operation of a drive circuit at the time of a turn-on operation of the power semiconductor element.

FIG. 2 is a waveform diagram showing the operation of drive circuit 110 at the time of the turn-on operation of power semiconductor element 100. FIG. 2 shows waveforms of: gate current ig in power semiconductor element 100; differential value D by differentiator 113; output signal S11 from first comparator 114; integral value I by integrator 115; output signal S12 from second comparator 116; and output signal SS100 from logic unit 117, in this order from the top. The direction of gate current ig flowing into gate terminal 100g is defined as a forward direction.

As shown in FIG. 2, when a turn-on command is input into gate terminal 100g of power semiconductor element 100 at time t0, gate current ig gradually increases. Gate current ig starts to decrease at time t1 after time t0. Then, at time t3, gate current ig increases again. At time t4, gate current ig starts to decrease again and thereafter gradually decreases to zero. In other words, the time waveform of gate current ig includes maximum points at time t1 and time t4, and a minimum point at time t3 that is sandwiched between these two maximum points.

Hereinbelow, the time waveform of gate current ig shown in FIG. 2 is compared with the behavior of power semiconductor element 100 at the time of the turn-on operation.

In an MOSFET that forms power semiconductor element 100, the capacitance generated with reference to gate terminal 100g includes: a parasitic capacitance component generated between gate terminal 100g and source terminal 100s (hereinafter referred to as a "gate-source capacitance Cgs"); and a parasitic capacitance component generated between gate terminal 100g and drain terminal 100d (hereinafter referred to as a "gate-drain capacitance Cgd"). Gate-drain capacitance Cgd corresponds to a feedback capacitance in the MOSFET. Gate-drain capacitance Cgd and gate-source capacitance Cgs are connected in parallel with reference to gate terminal 100g.

When a turn-on command is input into gate terminal 100g at time t0, gate-source capacitance Cgs is first charged with gate current ig. Due to charging of gate-source capacitance Cgs, gate voltage Vgs gradually rises. When gate voltage Vgs exceeds a threshold voltage, power semiconductor element 100 is started to be turned on. The first maximum point of gate current ig (at time t1) shows the state where gate-source capacitance Cgs is charged.

When power semiconductor element 100 is turned on, a current starts to flow between drain terminal 100d and source terminal 100s, and the voltage on drain terminal 100d starts to decrease. Most of gate current ig flows through gate-drain capacitance Cgd, but no current flows through gate-source capacitance Cgs. Thus, gate voltage Vgs does not rise but is kept constant. This time period during which gate voltage Vgs is constant is referred to as a "Miller period". Also, this constant voltage value is referred to as a "Miller voltage". The minimum point of gate current ig (at time t3) shows the state where gate current ig flows through gate-drain capacitance Cgd. In other words, the minimum point of gate current ig shows the Miller period of power semiconductor element 100.

As described above, at the timing at which this gate current ig reaches a minimum value, drain terminal 100d and source terminal 100s of power semiconductor element 100 are brought into conduction, and a current starts to flow therethrough. As described below, drive circuit 110 according to the present embodiment is configured to detect this timing at which gate current ig reaches a minimum value, thereby detecting the Miller period of power semiconductor element 100. Drive circuit 1110 detects the Miller period of power semiconductor element 100, and thereby can detect the timing at which power semiconductor element 100 is brought into a conducting state.

At and after time t3, gate-source capacitance Cgs is again charged with gate current ig. Thus, gate voltage Vgs rises to a gate drive power supply voltage. Then, gate current ig gradually decreases and finally converges to zero.

In FIG. 2, differential value D shows the inclination of the temporal change of gate current ig. Differential value D shows a positive value while gate current ig rises. Differential value D shows a negative value while gate current ig decreases. In the example in FIG. 2, differential value D shows a positive value at and after time t0. Then, at time t1, differential value D changes to a negative value. This time t1 corresponds to the first maximum point of gate current ig.

At subsequent time t3, differential value D changes from a negative value to a positive value again. This time t3 corresponds to a minimum point of gate current ig. Differential value D changes to a negative value again at time t4, and thereafter, gradually converges toward zero. Time t4 corresponds to the second maximum point of gate current ig.

In this way, differential value D shows a value of zero at the maximum point and the minimum point of gate current ig. Output signal S11 from first comparator 114 shifts to an H level when differential value D>0 (=REF1), and shifts to an L level when differential value D≤0. Thus, signal S11 shifts from an H level to an L level at time t1 and time t4 at which differential value D reaches a maximum point. Also, signal S11 shifts from an L level to an H level at time t3 at which differential value D reaches a minimum point.

In contrast, since integral value I is obtained by time integration of the waveform of gate current ig, this integral value I increases as an increasing function, starting from time t0 as an origin point. The increase rate of integral value I (equivalent to the inclination of the waveform of integral value I) becomes gradual at and after the timing of the first maximum point (at time t1). At and around the timing of the minimum point (time t3), integral value I is kept constant.

As described above, integral value I is proportional to gate voltage Vgs. Thus, the Miller period during which gate voltage Vgs is constant is reflected in the waveform of integral value I. The length of the Miller period depends on gate-drain capacitance Cgd. As gate-drain capacitance Cgd becomes smaller, the Miller period becomes shorter. As gate-drain capacitance Cgd becomes larger, the Miller period becomes longer. After the end of this Miller period, the increase rate of integral value I increases again. Then, after passing through the timing of the second maximum point (at time t4), the increase rate of integral value I converges to a constant value.

Thus, since integral value I is an increasing function, output signal S12 from second comparator 116 shifts from an L level to an H level at the timing at which integral value I exceeds second reference value REF2 (at time t2).

It is preferable that second reference value REF2 is set to be greater than zero and less than the Miller voltage, as shown in FIG. 2. More preferably, second reference value REF2 is set to be equal to or greater than a threshold voltage of power semiconductor element 100 and less than the Miller voltage. This allows signal S12 to shift to an H level at the timing (time t2) sandwiched between the timing (time t1) at which gate current ig reaches the first maximum point and the timing (time t3) at which gate current ig reaches the minimum point, as shown in FIG. 2.

Output signal SS100 from logic unit 117 shows a logical product of output signal S11 from first comparator 114 and output signal S12 from second comparator 116. Output signal SS100 is at an H level when signals S11 and S12 each shift to an H level. Accordingly, as shown in FIG. 2, signal SS100 is at an H level in a time period from the timing (time t3) at which gate current ig reaches the minimum point to the timing (time t4) at which gate current ig reaches the second maximum point.

In this way, signal SS100 shifts from an L level to an H level at the timing at which gate current ig becomes minimum, i.e., at the timing at which drain terminal 100d and source terminal 100s of power semiconductor element 100 each are brought into a conducting state to cause a current to start to flow. Thus, by detecting the timing at which output signal SS100 from logic unit 117 shifts to an H level, the timing at which power semiconductor element 100 is brought into a conducting state can be detected. Signal SS100 corresponds to one example of the "detection signal".

Referring back to FIG. 1, output signal SS100 from logic unit 117 in drive circuit 110 and output signal SS200 from logic unit 217 in drive circuit 200 are input into determination unit 1000. As described with reference to FIG. 2, signal SS100 shifts to an H level at the timing at which power semiconductor element 100 is brought into a conducting state. Similarly, signal SS200 shifts to an H level at the timing at which power semiconductor element 200 is brought into a conducting state.

Determination unit 1000 compares signal SS100 with signal SS200 to thereby determine whether an overcurrent state occurs or not in any of power semiconductor elements 100 and 200. Specifically, based on the time difference between the timing at which signal SS100 shifts from an L level to an H level and the timing at which signal SS200 shifts from an L level to an H level, determination unit 1000 determines whether an overcurrent state occurs or not in any of power semiconductor elements 100 and 200.

Figure 3A:
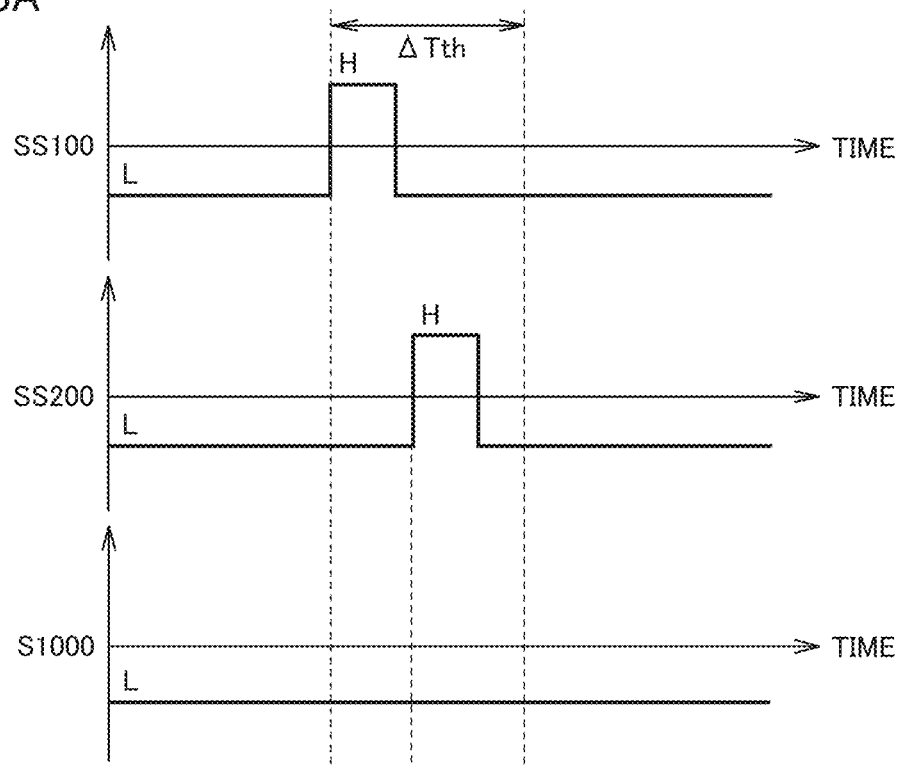
FIG. 3A is a diagram for illustrating a determination operation in a determination unit.
Figure 3B:
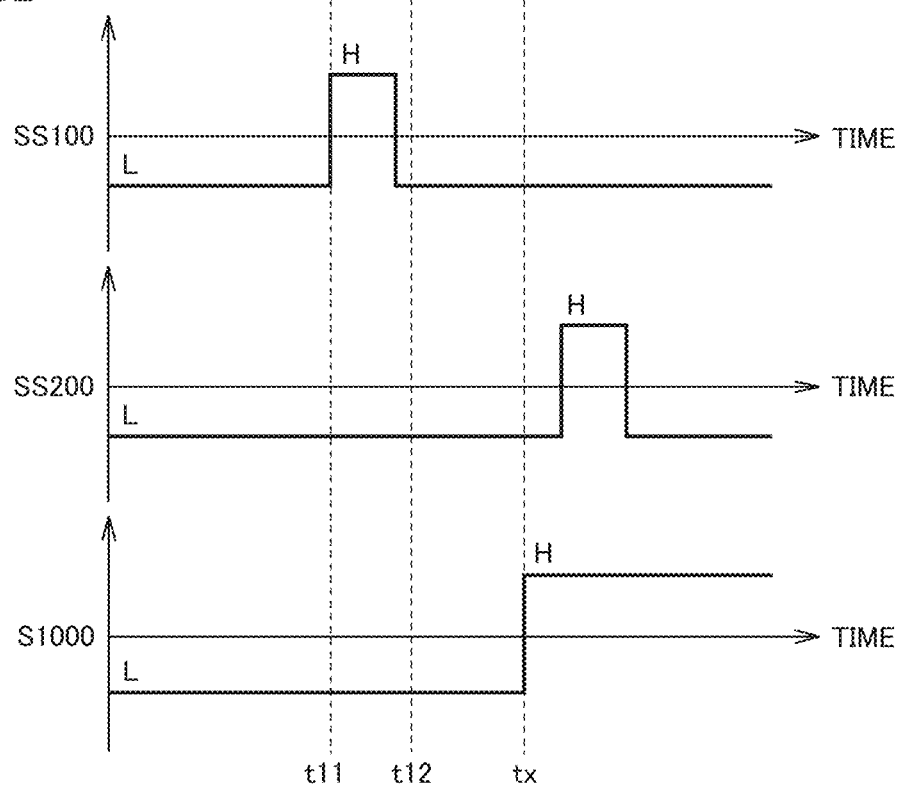
FIG. 3B is a diagram for illustrating the determination operation in the determination unit.

FIGS. 3A and 3B each are a diagram for illustrating the determination operation in determination unit 1000. FIGS. 3A and 3B each show the case where signal SS100 shifts to an H level for the first time since time t0 at which a turn-on command is input into the gate terminal of each of power semiconductor elements 100 and 200.

Referring to FIG. 3A, determination unit 1000 stores time t11 at which signal SS100 shifts to an H level. Then, determination unit 1000 waits for signal SS200 to shift from an L level to an H level from time t11 stored therein to time tx at which a threshold time ΔTth elapses. When signal SS200 shifts to an H level by time tx, determination units 1000 determines that an overcurrent state does not occur in both power semiconductor elements 100 and 200. Determination unit 1000 outputs signal S1000 of an "L" level showing that power semiconductor elements 100 and 200 normally operate.

Output signal S1000 from determination unit 1000 is input into control command unit 112 of drive circuit 110 and control command unit 212 of drive circuit 210. Upon reception of signal S1000 of an "L" level from determination unit 1000, each of control command units 112 and 212 keeps a corresponding one of the power semiconductor elements in an ON state. Then, upon reception of an OFF command input from outside, each of control command units 112 and 212 outputs a turn-off command to the gate terminal of the corresponding one of the power semiconductor elements.

In contrast, as shown in FIG. 3B, when signal SS200 does not yet shift to an H level at time tx at which threshold time ΔTth elapses since stored time t11, determination unit 1000 determines that an overcurrent state occurs in power semiconductor element 100. Then, determination unit 1000 outputs signal S1000 of an "H" level showing that an overcurrent state occurs in power semiconductor element 100.

Upon reception of signal S1000 of an "H" level from determination unit 1000, each of control command units 112 and 212 outputs a turn-off command to the gate terminal of a corresponding power semiconductor element for interrupting this corresponding power semiconductor element. Thereby, power semiconductor elements 100 and 200 each are brought into an OFF state.

Also in the case where signal SS200 shifts to an H level for the first time since the time at which a turn-on command is input into the gate terminal of each of power semiconductor elements 100 and 200, it can be determined by the same method whether an overcurrent state occurs or not in any of power semiconductor elements 100 and 200, based on the time difference between the timing at which signal SS200 shifts to an H level and the timing at which signal SS100 shifts to an H level.

As described above, according to drive device 1 in the first embodiment, each of the drive circuits, which drive the respective power semiconductor elements connected in parallel, detects a Miller period of a corresponding power semiconductor element based on gate current ig of this corresponding power semiconductor element, and thereby can detect the timing at which this corresponding power semiconductor element is brought into a conducting state. Then, by comparing the timings at which the power semiconductor elements detected by their respective drive circuits are brought into conducting states, an overcurrent state in any of the power semiconductor elements can be detected. As a result, an overcurrent state in any of the power semiconductor elements connected in parallel can be detected in a simple configuration.

Second Embodiment

Figure 4:
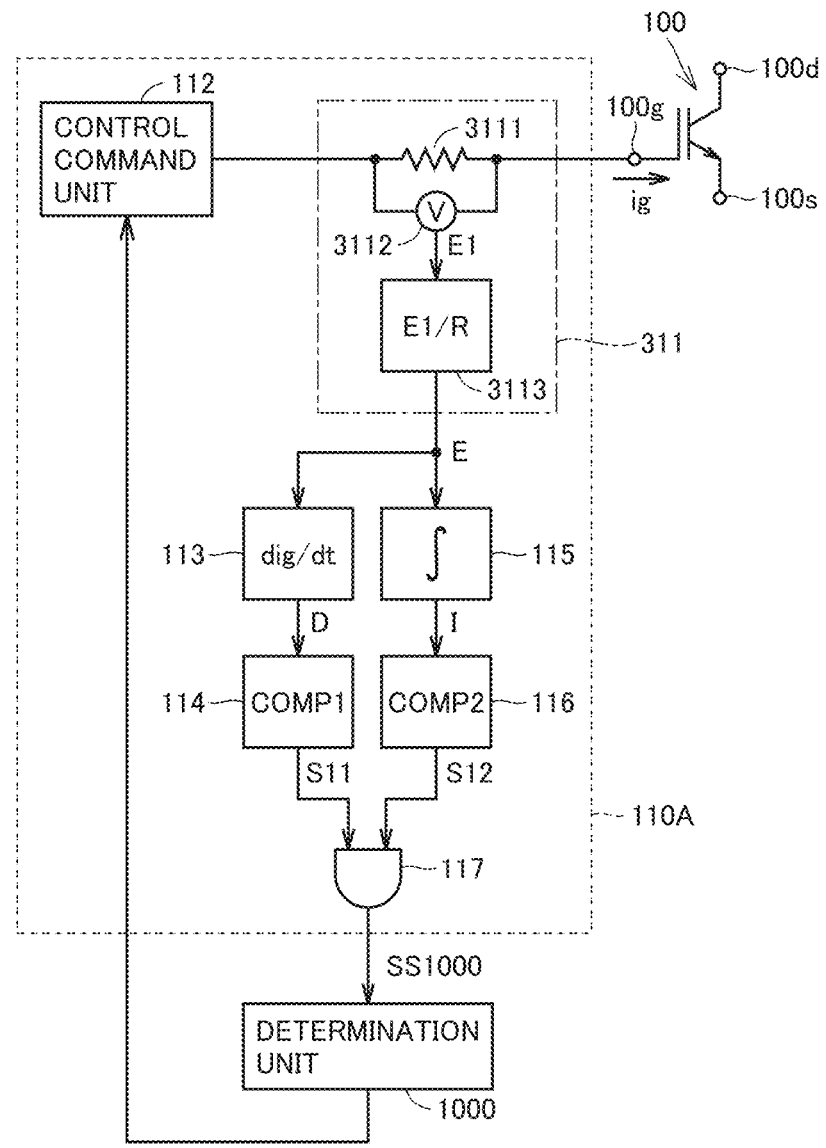
FIG. 4 is a diagram showing the configuration of a drive circuit for a power semiconductor element according to the second embodiment.

The second embodiment will be described with regard to another configuration example of drive circuits 110 and 210 according to the present embodiment. FIG. 4 shows only a drive circuit 110A in power semiconductor element 100, but the second embodiment is applicable also to drive circuit 210 in power semiconductor element 200.

Referring to FIG. 4, drive circuit 110A serves to drive power semiconductor element 100 and includes a gate current detection unit 311, a control command unit 112, a differentiator 113, a first comparator 114, an integrator 115, a second comparator 116, and a logic unit 117. Drive circuit 110A is different from drive circuit 110 shown in FIG. 1 in that it includes gate current detection unit 311 in place of gate current detection unit 111. Since the configuration of other portions in drive circuit 110A is the same as that in drive circuit 110 in FIG. 1, the detailed description thereof will not be repeated.

Gate current detection unit 311 includes a resistance element 3111, a voltage detector 3112, and an operation unit 3113. Gate current detection unit 311 corresponds to one example of the "current detector".

Resistance element 3111 is electrically connected between the output terminal of control command unit 112 and gate terminal 100g of power semiconductor element 100. When gate current ig flows into gate terminal 100g in response to a turn-on command from control command unit 112, a voltage having a magnitude obtained by multiplying a resistance value R of resistance element 3111 by gate current ig is generated between the terminals of resistance element 3111.

Voltage detector 3112 detects a voltage E1 between the terminals of resistance element 3111. A commonly-used voltmeter can be used as voltage detector 3112. Voltage detector 3112 outputs a signal E1 that shows a detected voltage.

Operation unit 3113 divides detection value E1 from voltage detector 3112 by resistance value R of resistance element 3111, to thereby calculate gate current ig. Operation unit 3113 outputs a signal that shows voltage E corresponding to detected gate current ig.

As described in the first embodiment, differentiator 113 and first comparator 114 compare first reference value REF1 (=0) with differential value D that is obtained by time differentiation of voltage E corresponding to gate current ig, and outputs a signal S11 showing a comparison result. Integrator 115 and second comparator 116 compare second reference value REF2 with integral value I that is obtained by time integration of voltage E, and outputs a signal S12 showing a comparison result. Logic unit 117 outputs a signal SS1000 showing a logical product of output signal S11 from first comparator 114 and output signal S12 from second comparator 116. Signal SS1000 shifts from an L level to an H level at the timing at which power semiconductor element 100 is brought into a conducting state.

Thus, also in drive device 1 according to the second embodiment, drive circuit 110A in each of power semiconductor elements 100 and 200 connected in parallel detects the Miller period of a corresponding power semiconductor element based on differential value D and integral value I of gate current ig of the corresponding power semiconductor element, and thereby can detect the timing at which the corresponding power semiconductor element is brought into a conducting state. Then, based on the time difference between the timings detected by the respective drive circuits and at which the respective power semiconductor elements are brought into conduction, an overcurrent state in any of power semiconductor elements 100 and 200 can be detected. Accordingly, an overcurrent state in any of power semiconductor elements 100 and 200 can be detected in a simple configuration.

Third Embodiment

In drive circuits 110 and 110A shown in FIGS. 1 and 4, respectively, integrator 115 can calculate gate voltage Vgs by using the above-mentioned equation (1) and based on the value obtained by dividing the integral value, which is obtained by time integration of gate current ig, by gate-source capacitance Cgs.

Figure 5:
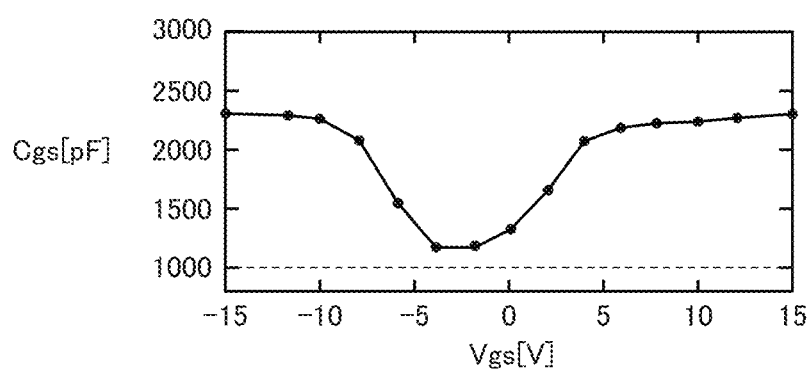
FIG. 5 is a diagram illustrating the dependency of a gate-source capacitance of the power semiconductor element upon a gate voltage.

In this case, it is known that gate-source capacitance Cgs is dependent on gate voltage Vgs. FIG. 5 shows an example of dependency of gate-source capacitance Cgs of the MOSFET upon gate voltage Vgs. Referring to FIG. 5, gate-source capacitance Cgs has a characteristic that its capacitance value becomes larger as the absolute value of gate voltage Vgs becomes larger on condition that gate voltage Vgs has a minimum value at and around 0V. Accordingly, when Cgs in the equation (1) is defined as a fixed value, a gap may occur between the operation value of gate voltage Vgs and actual gate voltage Vgs.

Thus, by employing Cgs in the equation (1) as a function of gate voltage Vgs, the accuracy in computing gate voltage Vgs can be improved. As the accuracy in computing gate voltage Vgs is enhanced, the accuracy in detecting the Miller period of the power semiconductor element can be enhanced. Accordingly, an overcurrent state in any of power semiconductor elements 100 and 200 can be accurately detected.

Fourth Embodiment

The above first embodiment has been described with regard to a configuration example of drive device 1 that drives two power semiconductor elements 100 and 200 connected in parallel. However, drive device 1 according to the present disclosure is applicable to a drive device that drives N (N is an integer equal to or greater than 2) power semiconductor elements connected in parallel as shown in FIG. 6.

Figure 6:
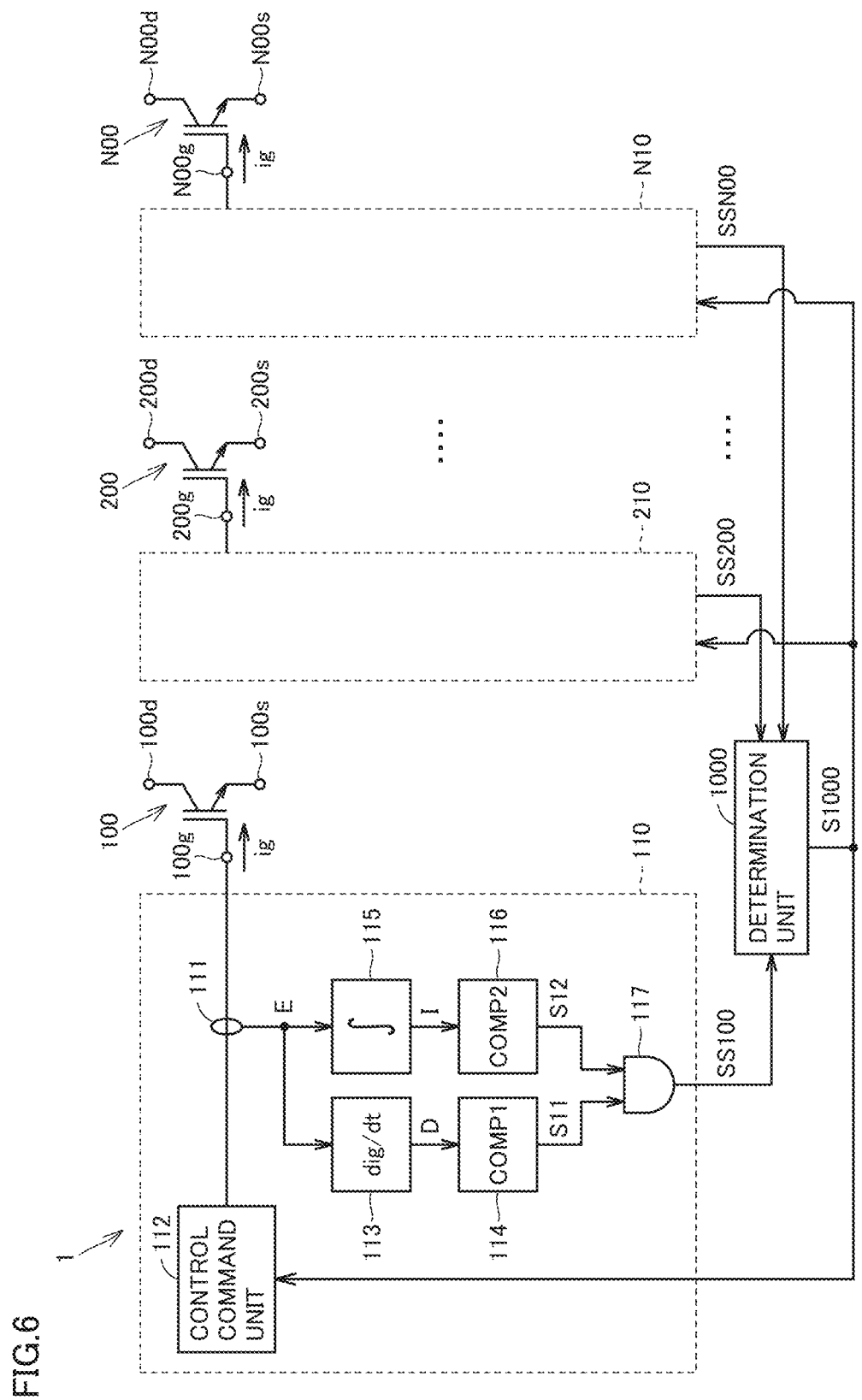
FIG. 6 is a diagram showing the configuration of a drive device for a power semiconductor element according to the fourth embodiment.

FIG. 6 is a diagram showing the configuration of a drive device for a power semiconductor element according to the fourth embodiment. Referring to FIG. 6, drive device 1 according to the fourth embodiment includes N drive circuits 110 to N10 that drive respective N power semiconductor elements 100 to N00.

N drive circuits 110 to N10 have the same configuration and each are configured to output a corresponding one of signals SS100 to SSN00 based on differential value D and integral value I of gate current ig from a corresponding one of the power semiconductor elements.

Upon reception of signals SS100 to SSN00 from respective drive circuits 110 to N10, determination unit 1000 compares signals SS100 to SSN00 with one another to determine whether an overcurrent state occurs or not in any of power semiconductor elements 100 to N00. Specifically, determination unit 1000 compares the timings at which signals SS100 to SSN00 each shift from an L level to an H level.

FIG. 7 is a diagram for illustrating the determination operation in determination unit 1000. FIG. 7 shows the case where signal SS100 shifts to an H level for the first time since time t0 at which a turn-on command is input into the gate terminal of each of power semiconductor elements 100 to N00.

Determination unit 1000 stores time t11 at which signal SS100 shifts to an H level. Then, determination unit 1000 waits for each of remaining (N−1) signals SS200 to SSN00 to shift to an H level in a time period from stored time t11 to time tx at which threshold time ΔTth elapses.

When all of (N−1) signals SS200 to SSN00 each shift to an H level by time tx, determination unit 1000 determines that no overcurrent state occurs in each of power semiconductor elements 100 to N00, and outputs a signal S1000 of an "L" level showing that power semiconductor elements 100 to N00 normally operate. Output signal S1000 from determination unit 1000 is input into the control command unit in each of drive circuits 110 to N00. Upon reception of signal S1000 of an "L" level from determination unit 1000, each control command unit keeps the corresponding power semiconductor element in an ON state. Then, upon reception of an OFF command input from outside, each control command unit outputs a turn-off command to the gate terminal of the corresponding power semiconductor element.

In contrast, as shown in FIG. 7, in the case where at least one of (N−1) signals SS200 to SSN00 does not shift to an H level at time tx at which threshold time ΔTth has elapsed since stored time t11, i.e., when all of signals SS100 to SSN00 do not shift to an H level at time tx, determination unit 1000 determines that an overcurrent state occurs in each of power semiconductor elements 100 to N00, and outputs signal S1000 of an "H" level showing that an overcurrent state occurs in each of power semiconductor elements 100 to N00. Upon reception of signal S1000 of an "H" level from determination unit 1000, each control command unit outputs a turn-off command to the gate terminal of a corresponding power semiconductor element for interrupting this corresponding power semiconductor element. Thereby, power semiconductor elements 100 to N00 each are brought into an OFF state.

According to drive device 1 in the present fourth embodiment, the timing at which N power semiconductor elements connected in parallel are brought into conduction can be detected based on gate current ig in a simple configuration. Thus, even in the case where the number of power semiconductor elements connected in parallel is increased with increased capacitance of the power converter, increased size and increased cost of the drive device can be suppressed.

The embodiments of the present invention may be combined in any way or modified or omitted as appropriate, within the scope of the invention.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1 drive device, 100, 200 power semiconductor element, 100d, 200d drain terminal, 100s, 200s source terminal, 100g, 200g gate terminal, 110, 110A, 210 drive circuit, 111, 311 gate voltage detection unit, 113, 213 differentiator, 114, 214 first comparator, 115, 215 integrator, 116, 216 second comparator, 117, 217 logic unit, 1000 determination unit, 112, 212 control command unit, 3111 resistance element, 3112 voltage detector, 3113 operation unit, REF1 first reference value, REF2 second reference value, D differential value, I integral value.

The invention claimed is:

1. A drive device that drives a plurality of power semiconductor elements connected in parallel, each of the power semiconductor elements having a first terminal, a second terminal, and a gate terminal, the drive device comprising:
a plurality of drive circuits each to drive a corresponding power semiconductor element of the power semiconductor elements; and
a determination unit, wherein
each of the drive circuits includes
a control command unit to output a turn-on command for the corresponding power semiconductor element, a current detector to detect a gate current that flows into the gate terminal of the corresponding power semiconductor element after the control command unit outputs the turn-on command,
  a differentiator to perform time differentiation of the gate current detected by the current detector, and
  an integrator to perform time integration of the gate current detected by the current detector, and
based on a differential value by the differentiator and an integral value by the integrator in each of the device circuits, the determination unit determines whether an overcurrent state occur or not in any of the power semiconductor elements.

2. The drive device for a power semiconductor element according to claim 1, wherein
  based on the differential value by the differentiator and the integral value by the integrator, each of the drive circuits detects a timing at which the corresponding power semiconductor element is brought into conduction between the first terminal and the second terminal, and outputs a detection signal, and
  based on the detection signal output from each of the drive circuits, the determination unit determines whether an overcurrent state occurs or not in any of the power semiconductor elements.

3. The drive device for a power semiconductor element according to claim 2, wherein
  each of the drive circuits detects a Miller period of the corresponding power semiconductor element based on the differential value by the differentiator and the integral value by the integrator.

4. The drive device for a power semiconductor element according to claim 3, wherein
  each of the drive circuits detects the Miller period based on a timing: at which the integral value by the integrator is greater than a reference value; and at which the differential value by the differentiator changes from a negative value to a positive value.

5. The drive device for a power semiconductor element according to claim 2, wherein
  based on a difference of time at which each of the drive circuits outputs the detection signal, the determination unit determines whether an overcurrent state occurs or not in any of the power semiconductor elements.

6. The drive device for a power semiconductor element according to claim 5, wherein
  when reception of the detection signal from each of all the drive circuits does not complete at a time point at which a threshold time elapses since reception of the detection signal from a first drive circuit among the drive circuits, the determination unit determines that the overcurrent state occurs.

7. The drive device for a power semiconductor element according to claim 1, wherein
  the integrator calculates a gate voltage of the corresponding power semiconductor element based on a value obtained by dividing the integral value by a capacitance between the gate terminal and the second terminal, the integral value being obtained by time integration of the gate current detected by the current detector.

8. The drive device for a power semiconductor element according to claim 7, wherein
  the integrator applies the capacitance between the gate terminal and the second terminal as a function of the gate voltage of the corresponding power semiconductor element.

* * * * *